United States Patent [19]
Chi et al.

[11] Patent Number: 5,870,343
[45] Date of Patent: Feb. 9, 1999

[54] DRAM SENSING SCHEME FOR ELIMINATING BIT-LINE COUPLING NOISE

[75] Inventors: Min-Hwa Chi; Ming-Zen Lin, both of Hsinchu, Taiwan

[73] Assignee: Vanguard International Semiconductor Corporation, Hsin-Chu, Taiwan

[21] Appl. No.: 55,443

[22] Filed: Apr. 6, 1998

[51] Int. Cl.$^6$ .................................................. G11C 7/00
[52] U.S. Cl. ........................................ 365/203; 365/149
[58] Field of Search ................................... 365/203, 149, 365/189.11

[56] References Cited

U.S. PATENT DOCUMENTS

| | | | |
|---|---|---|---|
| 5,010,523 | 4/1991 | Yamauchi | 365/205 |
| 5,276,641 | 1/1994 | Sprogis et al. | 365/189.02 |
| 5,625,585 | 4/1997 | Ahn et al. | 365/63 |
| 5,627,789 | 5/1997 | Kalb, Jr. | 365/205 |
| 5,740,113 | 4/1998 | Kaneko | 365/203 |
| 5,761,123 | 6/1998 | Kim et al. | 365/203 |

OTHER PUBLICATIONS

A. Bellaovar et al. "Low Power Digital VLSI Design–Circuits and Systems" Kiuwer Academic, Chapter 6, Section 6,2.1,3.9, pp. 381–383, 1995.

M. Aoki et al. "A 60–ns 16mb CMOS DRAM With a Transposed Data–Line Structure" IEEE Trans Sloid–State Circuits SC–23, No. 5, p. 1113, 1998.

*Primary Examiner*—Son T. Dinh
*Attorney, Agent, or Firm*—George O. Saile; Stephen B. Ackerman; Bill Knowles

[57] ABSTRACT

A pre-charge and isolation circuit for a folded bit line DRAM array to reduce noise coupling between adjacent bit lines of a DRAM array by connecting only one bit line within one sub-array to be connected to a sense amplifier, while the complementary bit line used for the reference voltage of the sense amplifier is selected from an adjacent sub-array, is disclosed. The isolation pre-charge circuit will be connected to a pair of bit lines within a DRAM array to pre-charge portions the pair of bit lines to a reference voltage level and to connect a selected DRAM cell to a latching sense amplifier.

13 Claims, 7 Drawing Sheets

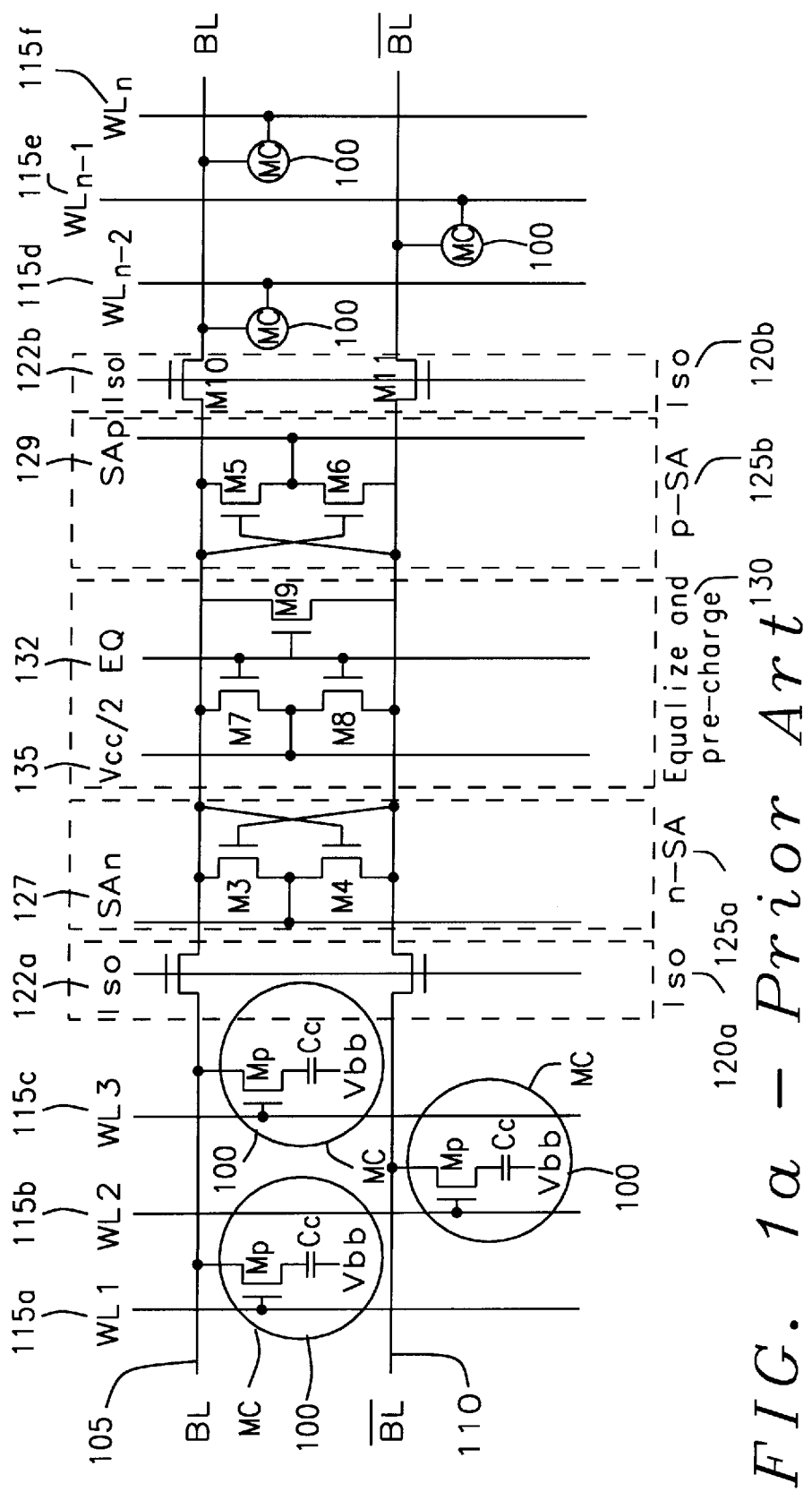
FIG. 1a – Prior Art

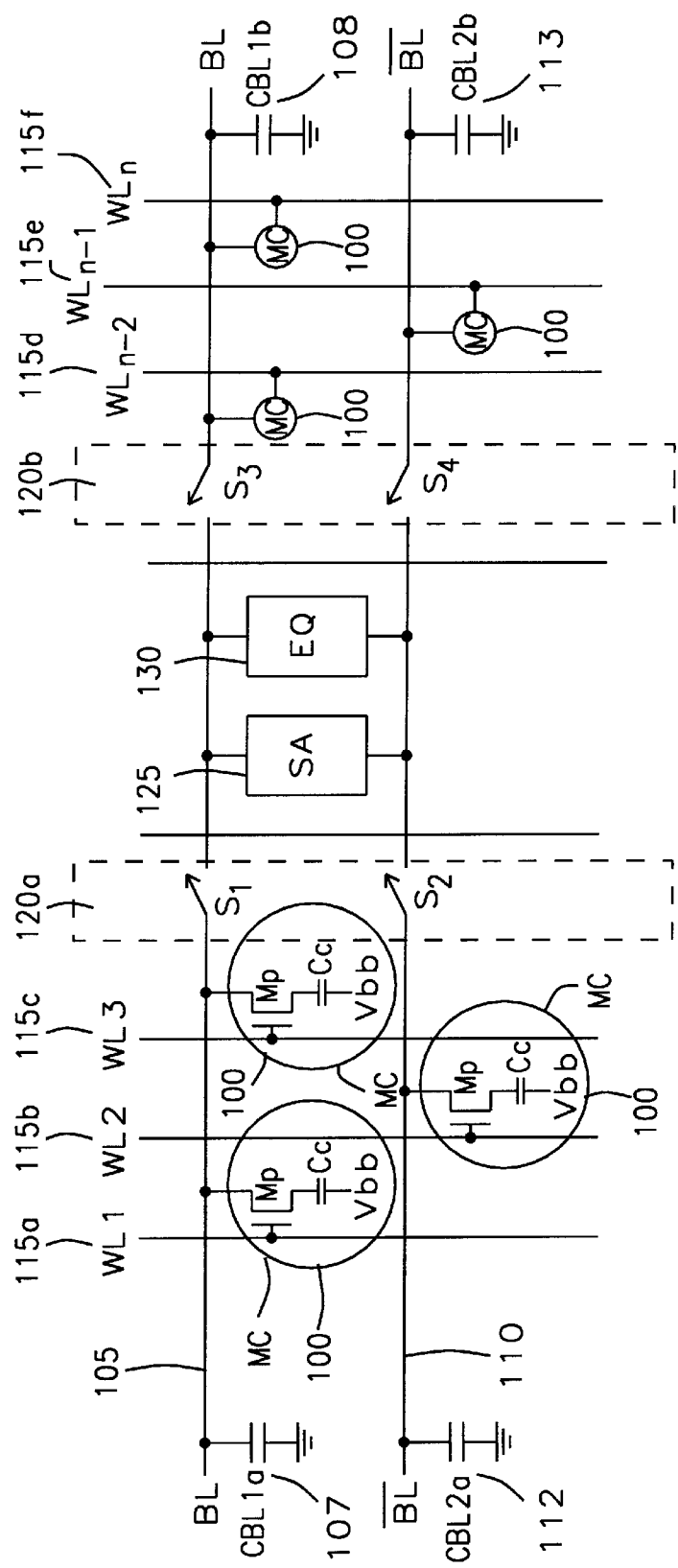
FIG. 1b – Prior Art

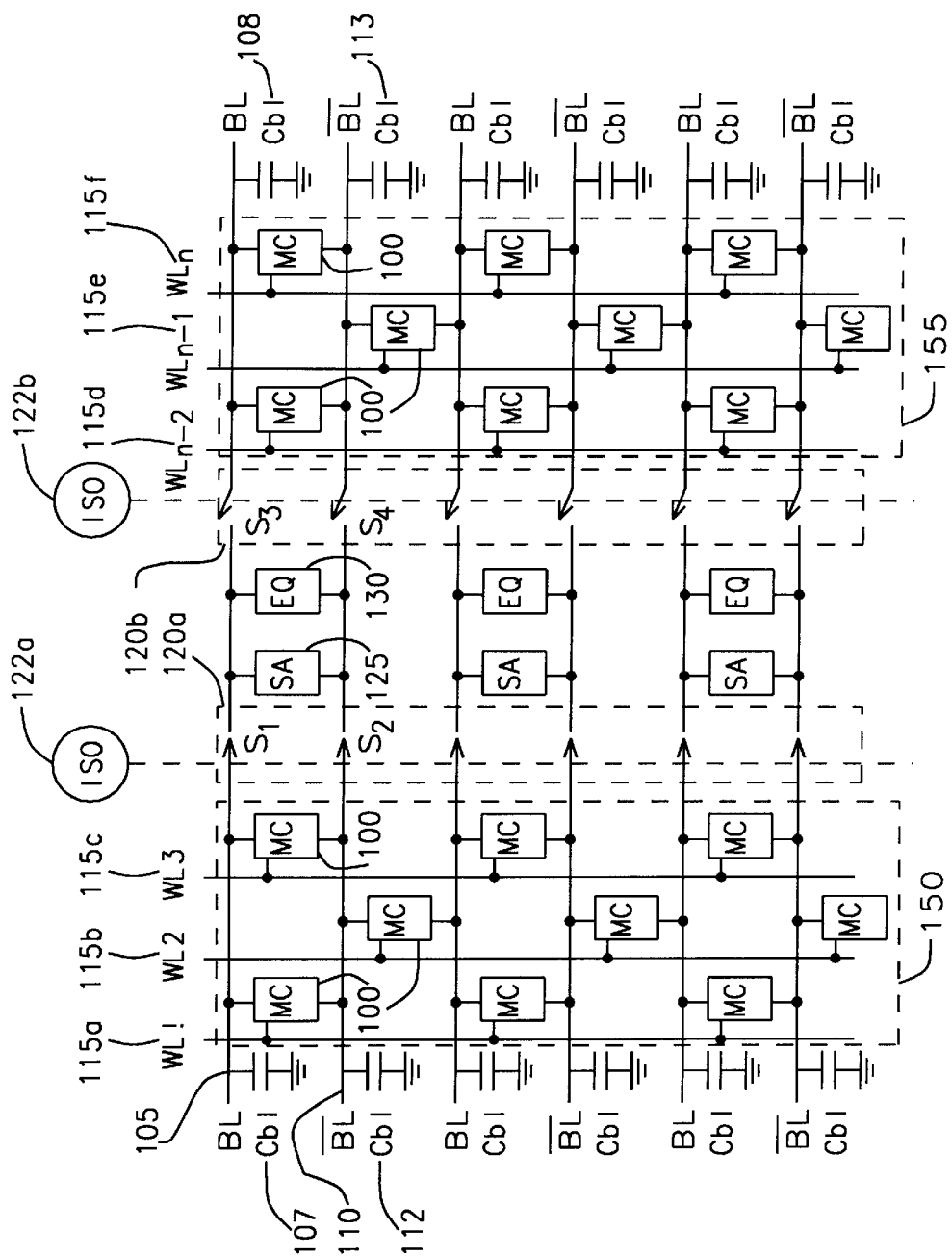
FIG. 2 – Prior Art

DRAM SENSING SCHEME FOR ELIMINATING BIT-LINE COUPLING NOISE

BACKGROUND OF THE INVENTION

1. Field of the Invention

This invention relates to Dynamic Random Access Memories (DRAM) and more particularly to support circuitry and circuit configurations for such DRAM arrays for pre-charging bit lines and sensing the charge level representing digital data in a DRAM cell.

2. Description of Related Art

The sensing scheme of folded-bit-line DRAM as described in A. Bellaouar and M. Elmasry, "Low power digital VLSI design—circuits and systems", Kiuwer Academic, Chapter 6, section 6,2.13.1, p.381–383, 1995, and shown in FIGS. 1a and 1b is well known in the art. The pass transistor $M_p$ and the cell capacitor $C_c$ form the memory cells 100. The gates of the pass transistors $M_p$ are connected to the word lines $WL_1$ 115a, $WL_2$ 115b, $WL_3$ 115c, $WL_{n-2}$ 115d, $WL_{n-1}$ 115e, and $WL_n$ 115f. The sources of the pass transistors $M_p$ are connected to the primary and complementary bit lines BL 105 and $\overline{BL}$ 110. When the word line $WL_1$ 115a $WL_2$ 115b, $WL_3$ 115c, $WL_{n-2}$ 115d, $WL_{n-1}$ 115e, or $WL_n$ 115f is brought to a voltage level $V_h$ that is higher than the power supply voltage source $V_{cc}$ by approximately one threshold voltage $V_T$ level of the pass transistor $M_p$, the pass transistor $M_p$ will be turned on to allow the charging and discharging of the cell capacitance $C_c$ without the voltage drop of the threshold voltage $V_T$ level of the pass transistor $M_p$.

The N-type metal oxide semiconductor (MOS) transistors $M_3$ and $M_4$ form the negative sense amplifier 125a and the P-type MOS transistors $M_5$ and $M_6$ form the positive sense amplifier 125b. The negative sense amplifier voltage source 127, which is connected to the ground GND, and the positive sense amplifier voltage source 129, which connected to the power supply voltage source $V_{cc}$, provide the necessary voltage to latch the negative sense amplifier 125a and the positive sense amplifier 125b.

The N-type MOS transistors $M_7$, $M_8$, and $M_9$ form the pre-charge and equalization circuit 130. The gates of the MOS transistors $M_7$, $M_8$, and $M_9$ are connected to the pre-charge and equalization control voltage source 132. The drains of the MOS transistors $M_7$ and $M_8$ are connected to the reference voltage source $V_{cc}/2$ 135. The sources of the MOS transistors $M_7$ and $M_8$ are connected respectively to the primary and complementary bit lines BL 105 and $\overline{BL}$ 110.

When the pre-charge and equalization control voltage source 132 is brought to a level sufficient to turn on the MOS transistors $M_7$, $M_8$, and $M_9$, the primary and complementary bit lines BL 105 and $\overline{BL}$ 110 are pre-charged to the voltage level that is one half the voltage level of the power supply voltage source ($V_{cc}/2$), and the MOS transistor $M_9$ will equalize any voltage difference between the primary and complementary bit lines BL 105 and $\overline{BL}$ 110. The pre-charging operation is the charging of the distributed capacitance of each of the primary and complementary bit lines BL 105 and $\overline{BL}$ 110 as represented by the capacitors $CBL_{1a}$ 107, $CBL_{1b}$ 108, $CBL_{2a}$ 112, $CBL_{2b}$ 113.

The MOS transistors $M_1$, $M_2$, $M_{10}$, and $M_{11}$ form the isolation circuits 120a and 120b that divide the primary and complementary bit lines BL 105 and $\overline{BL}$ 110 into segments so as to isolate the memory cells 100 from the negative and positive sense amplifiers 125a and 125b and the pre-charge and equalization circuit 130. The isolation voltage control circuit 122a is attached to the gates of the MOS transistors $M_1$ and $M_2$. The isolation voltage control circuit 122b is attached to the gates of the MOS transistors $M_{10}$ and $M_{11}$. The isolation voltage control circuit 122a and 122b will turn on or turn off the MOS transistors $M_1$, $M_2$, $M_{10}$, and $M_{11}$ selectively to connect the memory cells 100 to the negative and positive sense amplifiers 125a and 125b and the pre-charge and equalization circuit 130. The switches $S_1$, $S_2$, $S_3$, and $S_4$ are single pole single throw switches that are formed respectively by the MOS transistors $M_1$, $M_2$, $M_{10}$, and $M_{11}$. Typically, the isolation voltage control circuit 122a will turn on switches $S_1$, $S_2$. At the same time, the isolation voltage control circuit 122b will turn off switches $S_3$, and $S_4$. Or conversely, the isolation voltage control circuit 122a will turn off switches $S_1$, $S_2$. At this same time, the isolation voltage control circuit 122b will turn on switches $S_3$, and $S_4$. The isolation voltage control circuits 122a and 122b will not turn on or turn off switches $S_1$ and $S_2$ and switches $S_3$, and $S_4$ simultaneously.

FIG. 2 shows multiple rows of the DRAM cells as arranged in FIGS. 1a and 1b. The read operation begins by the isolation voltage control circuit 122a activating the switches $S_1$ and $S_2$ in the isolation circuit 120a to couple the segment of the primary and complementary bit lines BL 105 and $\overline{BL}$ 110 connected to the sub-array of DRAM cells 150. The isolation voltage control circuit 122b will maintain the switches $S_3$ and $S_4$ of the isolation circuit 120b open to isolate the segment of the primary and complementary bit lines BL 105 and $\overline{BL}$ 110 connected to the sub-array of DRAM cells 155 of the DRAM cells.

The equalization circuit 130 will be activated as described above to pre-charge the bit line capacitances 107 and 112 and equalize any voltage difference between the primary and complementary bit lines BL 105 and $\overline{BL}$110.

A word line attached to the DRAM cells 100 that are to be read is activated. For instance, if the DRAM cells 100 attached to word line WL3 115c are to be read, the word line WL3 115c will be brought to a voltage level $V_h$ that is greater than the power supply voltage source by at least the one threshold voltage $V_T$ of the pass transistor $M_p$ of the DRAM cells 100. The voltage level $V_h$ will activate the pass transistor $M_p$ of the DRAM cells 100 of FIGS. 1a and 1b with the voltage drop that is equal to threshold voltage $V_T$ of the pass transistor $M_p$ of the DRAM cells 100. The charge present on the cell capacitor $C_c$ of the DRAM cell 100 of FIGS. 1a and 1b will flow to or from the bit line BL 105.

The latching sense amplifier 125 will be activated to sense the change in voltage on the bit line BL 105 due to the selection of the DRAM cell 100 on the word line WL3 115c. The latching sense amplifier 125 will drive the bit line BL 105 to either the voltage level of the power supply voltage source $V_{cc}$ or the voltage level of the ground GND. The level of the bit line BL 105 is dependent upon the level of charge present on the cell capacitor $C_c$ of the DRAM cell 100. The latching sense amplifier 125 further will drive the bit line $\overline{BL}$ 110 to either the voltage level of the power supply voltage source $V_{cc}$ or the voltage level of the ground GND that is opposite that of the bit line BL 105.

This forcing both primary and complementary bit lines BL 105 and $\overline{BL}$ 110 to the voltage level difference between the voltage level of the power supply voltage source $V_{cc}$ and the voltage level of the ground GND is a well known source of noise, as is described in M. Aoki, et al., "A 60 ns 16 Mb CMOS DRAM with a transposed data-line structure", IEEE Trans. Solid-state Circuits, SC-23, No.5, p. 1113, 1988. As semiconductor processing technology has improved, the size of the DRAM cell 100 has been decreasing. This has increased impact of the noise to a point that it is becoming a serious source of data errors.

U.S. Pat. No. 5,276,641 (Sprogis et al) describes an open/folded bit line sense amplifier arrangement and accompanying circuit for a DRAM array. The basic structure consists of two memory arrays, each with a plurality of memory cells. These memory arrays employ a special cell layout architecture in which each cell shares only one passing word line with an adjacent cell. The memory cells are interconnected by bit lines which are parallel to each other and word line which are perpendicular to the bit lines. Between the two memory arrays, arranged in a column, is a set of open sense amplifiers. Each open sense amplifier has a connector on either side for respectively accessing each of the two memory arrays. One of the connectors multiplexed to preferably three adjacent bit lines of on array while the other connector is multiplexed to preferably three adjacent bit lines of the opposite array. On the outer side of each memory array at the opposite ends of the bit lines is a set of folded bit line sense amplifiers, each having two connectors which are multiplexed to preferably three adjacent bit lines in the array one of the bit lines being common to each of these connectors. When data is to be input or output from the memory cells in an array, a word line is activated. In such a selected array, the connectors of each of the folded bit line sense amplifiers are connected by the multiplexing circuitry to one bit line in that array. An intervening bit line separates the two bit lines to which they are connected. Simultaneously, the connectors of an open bit line sense amplifier are activated, on being connected to a bit line in the selected array and the other being connected to a bit line in the unselected array, the later being surrounded on either side by bit lines clamped to AC ground, thus balancing the open sense amplifier capacitively and thereby greatly reducing bit-line coupling noise.

U.S. Pat. No. 5,625,585 (Ahn et al.) describes a bit line structure that has low power consumption. The bit line structure will allow reduced chip operating current without expanding the layout area. Further the sensing noise between bit lines can be reduced compared with the conventional methods.

The bit line structure has a plurality of sense amplifiers each connected to two pairs of bit lines BL and /BL through bit line selecting switches. A plurality of memory cells are connected to the bit lines BL and /BL. A first bit line pair BL and /BL and a second bit line pair BL and /BL are formed by dividing a bit line disposed within a same line respectively in a cell array. A first connecting bit line will connect the bit line BL of said second bit line pair to the sense amplifier, and a second connecting bit line will connect the bit line /BL of the second bit line pair to the sense amplifier. The second connecting bit line will have two crossing sections crossing with another second connecting bit line for connecting a bit line BL of a second bit line belonging to an adjacent sense amplifier. The bit line selecting switches connect the first bit line pair and the second bit line pair respectively to the sense amplifier. The number of memory cells connected to each bit line is reduced to ½ compared with the conventional technique. The bit lines are arranged 3-dimensionally to eliminate the area loss in carrying out the layout, and particularly, the connecting bit lines are made of a conductive material, which has a smaller resistance than a conductive material of the bit lines.

The second connecting bit line passes over the first bit line of the bit line BL of another sense amplifier, and among the two crossing points one of them is located between the sense amplifier and the bit line selecting switch. The first and second connecting bit lines are composed of a material different from that of the first and second bit lines.

U.S. Pat. No. 5,010,523 (Yamauchi) discloses a sensing circuit for a DRAM. The bit lines of the DRAM array that are the reference side are temporarily connected to a large load capacitance or to a pre-charge power source when a read operation is performed. This will prevent change in electric potential of the bit lines at the reference side occurring due to interference noises between the bit lines from effecting a read operation. Connecting the reference side of the bit lines to the large load capacitance or to the pre-charge power source will further prevent deterioration of a signal-to-noise ratio due to the change in electric potential of the bit lines.

U.S. Pat. No. 5,627,789 (Kalb, Jr.) describes a differential voltage memory apparatus, which includes one or more preliminary stages of differential amplifiers, which operate prior to triggering of a final stage of differential amplifiers. The preliminary stages of differential amplifiers include cross-coupled inverters that are closely coupled to bit lines connected to memory cells of the memory array. The final stage of sense amplifiers include cross-coupled inverters which are, when in use, substantially decoupled from the bit lines of the memory cells. The preliminary sense amplifiers are activated shortly after activation of corresponding memory cells and provide an initial stage of amplification of a voltage differential generated by the memory cells. The final stage sense amplifiers are triggered after a suitable time delay guaranteeing that a sufficient minimum voltage differential has been generated. The preliminary sense amplifier stages, which are closely coupled to the bit lines and are thereby subject to heavy capacitive loading. These capacitive loaded preliminary sense amplifier stages provide an initial stage of amplification which is substantially decoupled from noise effects, such as effects caused by alpha strikes and the like. The final stage of sense amplifiers, which are substantially decoupled from the capacitive bit lines, are coupled to the preliminary sense amplifier stages to quickly amplify the voltage differential to opposing rail voltages.

SUMMARY OF THE INVENTION

An object of this invention is to provide an isolation and pre-charge circuit for a folded bit line DRAM array.

Another object of this invention is to reduce noise coupling between adjacent bit lines of a DRAM array.

Further another object of this invention is to provide a pre-charge and isolation circuit that will allow only a primary bit line to be connected to a sense amplifier, while the complementary bit line remains at a reference voltage level.

To accomplish these and other objects an isolation pre-charge circuit will be connected to a pair of bit lines within DRAM sub-arrays of a DRAM array to pre-charge portions of the pair of bit lines to a voltage level of a reference voltage source and to connect a selected DRAM cell to a latching sense amplifier. The pair of bit lines will be composed of a primary bit line and a complementary bit line. The isolation pre-charge circuit has a first single pole double throw switch. The first single pole double throw switch has a common terminal connected to one portion of the primary bit line, a first pole connect to the reference voltage source, a second pole connected to a first terminal of the latching sense amplifier and a first terminal of a pre-charge and equalization circuit, and a control terminal connected to a control circuit to selectively couple the common terminal to the first pole and the second pole. The isolation pre-charge circuit has a second single pole double throw switch. The second single pole double throw switch has a common terminal connected to a first portion of the complementary bit line of the pair of bit lines, a first pole connect to the reference voltage source, a second pole connected to a second terminal of the latching sense amplifier and a second terminal of a pre-charge and equalization circuit, and a control terminal connected to a control circuit to selectively couple the common terminal to the first pole and the second pole. The isolation pre-charge circuit has a third single pole double throw switch. The third single pole double throw switch has a common terminal connected to a second portion of the primary bit line, a first pole connect to the reference voltage source, a second pole connected to the first terminal of the latching sense amplifier and the first terminal of a pre-charge and equalization circuit, and a control terminal connected to a control circuit to selectively couple the common terminal to the first pole and the second pole. The isolation pre-charge circuit has a fourth single pole double throw switch. The fourth single pole double throw switch has a common terminal connected to a second portion of the complementary bit line of the pair of bit lines, a first pole connect to the reference voltage source, a second pole connected to the second terminal of the latching sense amplifier and the second terminal of a pre-charge and equalization circuit, and a control terminal connected to a control circuit to selectively couple the common terminal to the first pole and the second pole.

The first, second, third, and fourth single pole double throw switches are each constructed from a first MOS transistor of a first conductivity type and a second MOS transistor of a second conductivity.

The steps of reading a DRAM cell using an isolation pre-charge circuit are:

Activating the control terminal to couple the common pole of first, second, third, and fourth single pole double throw switches to the first pole of the first, second, third, and fourth single pole double throw switches to pre-charge all portions of the pair of bit lines connected to the DRAM cells to the voltage level of the reference voltage source.

Activating the control terminal of one of the single pole double throw switches connected to one portion of the bit line connected to selected DRAM cell with in one DRAM sub-array to couple the one portion of the bit line to one terminal of the latching sense amplifier and the pre-charge and equalization circuit.

Activating the control terminal of an opposite single pole double throw switches connected to an opposite portion of an opposite bit line on a non selected sub-array to couple the opposite portion of the opposite bit line to a second terminal of the latching sense amplifier and the pre-charge and equalization circuit.

Pre-charging and equalizing the portions of the pair of bit lines connected to the selected DRAM cell and the latching sense amplifier and the pre-charge and equalization circuit.

Activating the selected DRAM cell to transfer an electrical charge present within the selected DRAM cell to the portion of the bit line connected to the selected DRAM cell.

Activating the latching sense amplifier to sense the charge transferred to the portion of the bit line attached to the selected DRAM cell.

And maintaining the control terminal of the single pole double throw switches not connected to the portion of the bit line connected to the selected DRAM cell, such that the common terminal is connected to the first pole to maintain the portion of the bit line not connected to the selected DRAM cell at the voltage level of the reference voltage source.

BRIEF DESCRIPTION OF THE DRAWINGS

FIGS. 1a and 1b are schematic drawings of a row of DRAM cells of a DRAM array showing the isolation circuitry of the prior art.

FIG. 2 is a schematic drawing of a DRAM array of the prior art.

DETAILED DESCRIPTION OF THE INVENTION

Figure 3A:
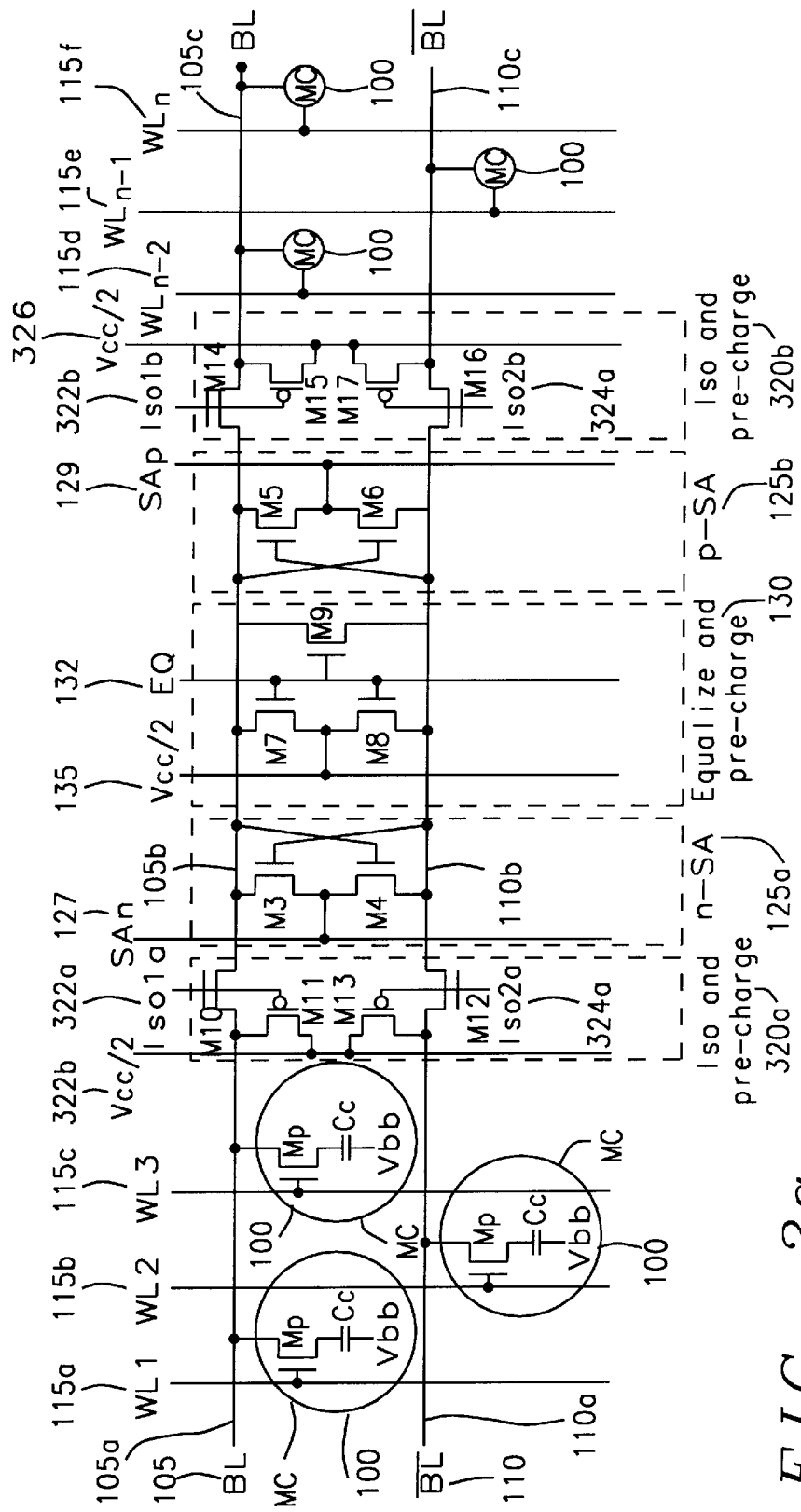
FIGS. 3a and 3b are schematic drawings of a row of DRAM cells of a DRAM array showing the isolation and pre-charge circuit of this invention.
Figure 3B:
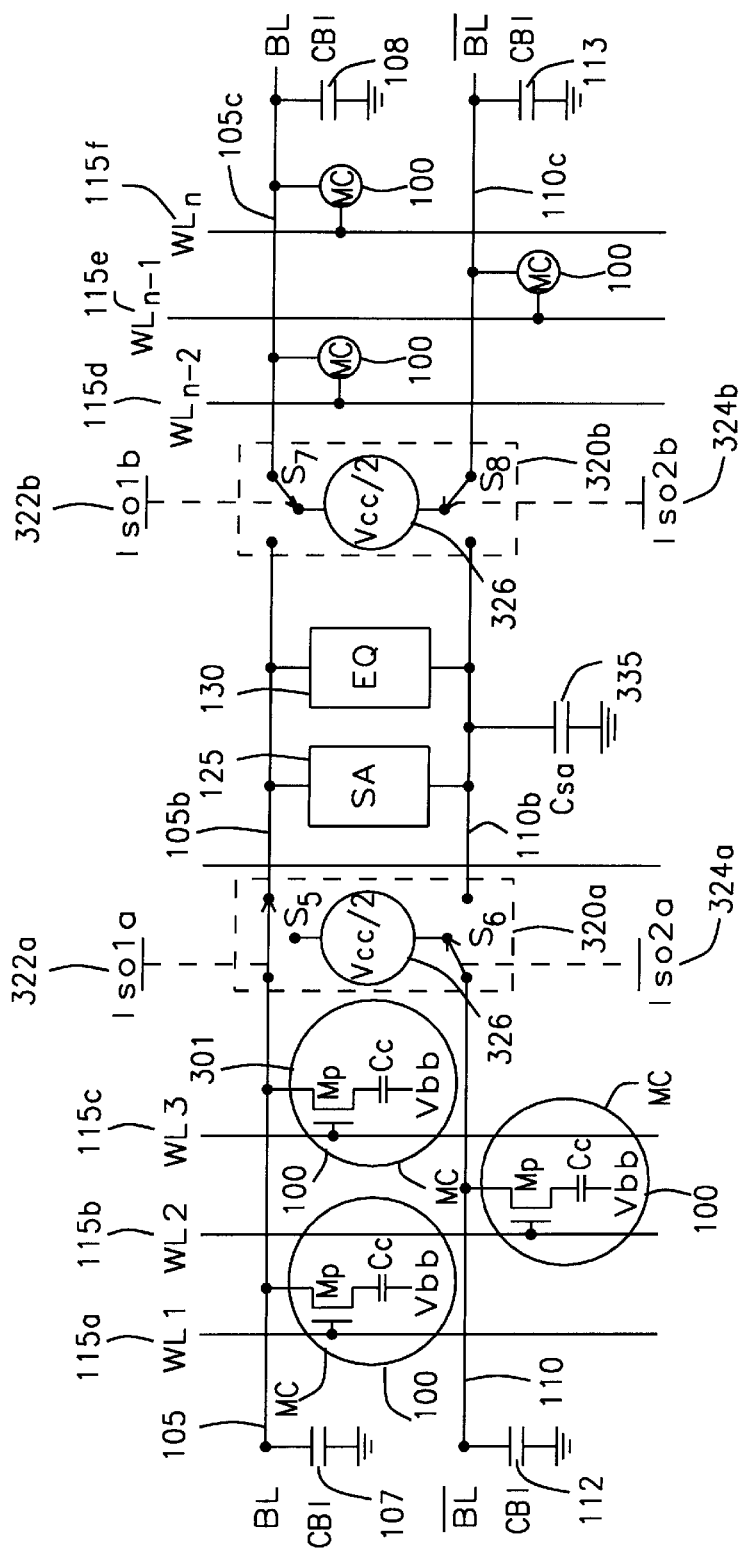

Refer now to FIGS. 3a and 3b to understand the structure of a row of DRAM cells employing the isolation pre-charge circuit of this invention. The structure of the DRAM cells 100 is as above described for FIGS. 1a and 1b. The primary and complementary bit lines BL 105 and $\overline{BL}$ 110 and the word lines $WL_1$ 115a, $WL_2$ 115b, $WL_3$ 115c, $WL_{n-2}$ 115d, $WL_{n-1}$ 115e, and $WL_n$ 115f are connected to the DRAM cells 100 as described above in Figs. 1a and b. Additionally, the latching sense amplifier 125 and the pre-charge and equalization circuit 130 are connected between the primary and complementary bit lines BL 105 and $\overline{BL}$ 110 and function as above described in FIGS. 1a and 1b.

The isolation and pre-charge circuits 320a and 320b replace the isolation circuit 120 of FIGS. 1a and 1b. The N-type MOS transistors $M_{10}$, $M_{12}$, $M_{14}$, $M_{16}$ are connected to the primary and complementary bit lines BL 105 and $\overline{BL}$ 110 to divide the primary and complementary bit lines BL 105 and $\overline{BL}$ 110 into individual portions to isolate the memory cells 100 from the positive and negative latching sense amplifiers 125a and 125b and the pre-charge and equalization circuit 130. The P-type MOS transistors $M_{11}$, $M_{13}$, $M_{15}$, $M_{17}$ are connected between the primary and complementary bit lines BL 105 and $\overline{BL}$ 110 and the reference voltage source $V_{cc}/2$ 326. The reference voltage source $V_{cc}/2$ 326 is as above described to have a voltage level that is one half of the voltage level of the power supply voltage source $V_{cc}$.

The gates of the N-type MOS transistor $M_{10}$ and the P-type MOS transistor $M_{11}$ are connected to the isolation voltage control circuit ISO1a 322a to selectively couple the portion of the primary bit line BL 105a to either the reference voltage source $V_{cc}/2$ 326 or the portion of the primary bit line BL 105b connected to the latching sense amplifier 125 and the pre-charge and equalization circuit 130. Similarly, the gates of the N-type MOS transistor $M_{12}$ and the P-type MOS transistor $M_{11}$ are connected to the isolation voltage control circuit ISO2a 324a to selectively couple the portion of the complementary bit line $\overline{BL}$ 110a to either the reference voltage source $V_{cc}/2$ 326 or the portion of the complementary bit line $\overline{BL}$ 100b connected to the latching sense amplifier 125 and the pre-charge and equalization circuit 130.

The gates of the N-type MOS transistor $M_{14}$ and the P-type MOS transistor $M_{15}$ are connected to the isolation voltage control circuit ISO1b 322b to selectively couple the portion of the primary bit line BL 105c to either the reference voltage source $V_{cc}/2$ 326 or the portion of the primary bit line BL 105b connected to the latching sense amplifier 125 and the pre-charge and equalization circuit 130. Similarly, the gates of the N-type MOS transistor $M_{16}$ and the P-type MOS transistor $M_{17}$ are connected to the isolation voltage control circuit ISO2b 324b to selectively couple the portion of the complementary bit line $\overline{BL}$ 110c to either the reference voltage source $V_{cc}/2$ 326 or the portion of the complementary bit line $\overline{BL}$ 110b connected to the latching sense amplifier 125 and the pre-charge and equalization circuit 130.

As is apparent, the structure of the N-type MOS transistor $M_{10}$ and the P-type MOS transistor $M_{11}$ will function as the single pole double throw switch $S_5$. Likewise, the N-type MOS transistor $M_{12}$ and the P-type MOS transistor $M_{11}$ form the single pole double throw switch $S_6$, the N-type MOS transistor $M_{14}$ and the P-type MOS transistor $M_{15}$ form the single pole double throw switch $S_7$, and the N-type MOS transistor $M_{16}$ and the P-type MOS transistor $M_{17}$ form the single pole double throw switch $S_8$. The control of the switches $S_5$, $S_6$, $S_7$, and $S_8$ will be respectively by the isolation voltage control circuits ISO1a 322a, ISO2a 324a, ISO1b 322b, and ISO2b 324b.

Figure 4:
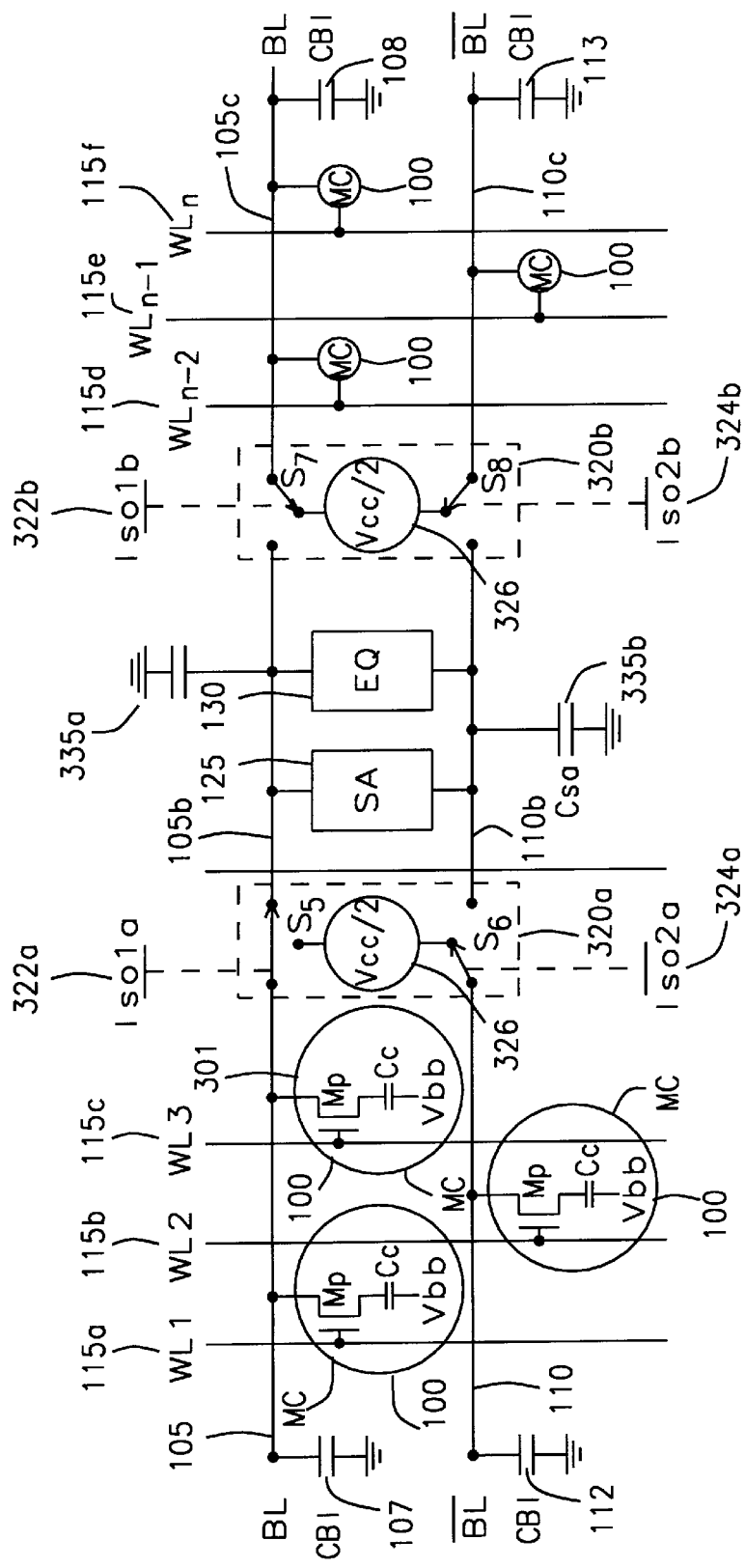
FIG. 4 is a schematic drawing of a row of DRAM cells showing a first method of operation of the isolation and pre-charge circuit of this invention.

Refer now to FIG. 4 to discuss the process of reading a selected DRAM cell 301 on a row of DRAM cells 100. Prior to commencing the read operation, the switches $S_5$, $S_6$, $S_7$, and $S_8$ are conditioned respectively by the isolation voltage control circuits ISO1a 322a, ISO2a 324a, ISO1b 322b, ISO2b 324b to connect the portions of the bit line BL 105a and 105c and $\overline{BL}$ 100a and 110c to the reference voltage source $V_{cc}/2$ 326.

The method for reading the selected DRAM cell 301 begins by the isolation voltage control circuit ISO1a 322a activating switch $S_5$ to connect the portion of the primary bit line BL 105a to the portion of the primary bit line BL 105b and the isolation voltage control circuit ISO2b 324b activating switch $S_8$ to connect the portion of the complementary bit line $\overline{BL}$ 110c to the portion of the complementary bit line $\overline{BL}$ 110b. The selected DRAM cell 301 is now connected to the latching sense amplifier 125 and the pre-charge and equalization circuit 130. The pre-charge and equalization circuit 130 is then activated to pre-charge the portions of the primary bit line BL 105a and 105b and the portion of the complementary bit line $\overline{BL}$ 110b and 110c to the voltage level of the reference voltage source $V_{cc}/2$ 135 of FIG. 3a. The voltage between the portions of the primary bit line BL 105a and 105b and the portion of the complementary bit line $\overline{BL}$110b and 110c are then equalized to remove any inequalities between the portions of the primary bit line BL 105a and 105b and the portions of the complementary bit line $\overline{BL}$ 110b. The pre-charge and equalization circuit is then disabled and the word line $WL_3$ 115c is activated to turn on the pass transistor $M_p$ of the selected DRAM cell 301. The charge present or absent on the cell capacitor $C_c$ of the selected DRAM cell 301 flows to or from the portions of the primary bit line BL 105a and 105b. The charge flowing to or from the portions of the primary bit line BL 105a and 105b will cause the voltage level present between the portions of the primary bit line BL 105a and 105b and the portions of the complementary bit line $\overline{BL}$ 110b and 110c to vary by approximately 100–200 mV. The latching sense amplifier 125 will be activated and sense the difference in voltage between the voltage present at the portions of the bit line BL 105a and 105b and the voltage present at the portions of the complementary bit line $\overline{BL}$ 110b and 110c. The difference will amplified and the portions of the primary bit line BL 105a and 105b will be forced to either the voltage level of the power supply voltage source $V_{cc}$ or the voltage level of the substrate biasing voltage $V_{ss}$, dependent on the level of the charge present on the cell capacitor $C_c$ of the selected DRAM cell 301. The portions of the complementary bit line $\overline{BL}$ 110b and 110c will be forced to the opposite voltage level of the portions of the primary bit line BL 105a and 105b.

During the sensing of the selected DRAM cell 301, the portion of the primary bit line BL 105c and the portion of the complementary bit line $\overline{BL}$ 110a will be maintained at the voltage level of the reference voltage source $V_{cc}/2$ 326.

The bit line capacitance $C_{sa}$ 335b is the capacitance of the portion of the complementary bit line $\overline{BL}$110b that is within the sense amplifier 125 and the pre-charge and equalization circuit 130. By activating the switch $S_8$ to connect the portions of the complementary bit line $\overline{BL}$110b and 110c, the capacitive loading due to the bit line capacitors $C_{sa}$ 335b and $C_{b1}$ 113 on the latching sense amplifier will be equal with the capacitive loading due to the bit line capacitors $C_{sa}$ 335a and $C_{b1}$ 108.

As can be seen the portions of the primary and complementary bit lines BL 105c and $\overline{BL}$ 110a are not activated to provide the reference voltage for the sensing of the selected DRAM cell 301 and are placed at the voltage level of the reference voltage source $V_{cc}/2$ 326. This will effectively isolate the active portions of the primary and complementary bit line BL 105a and 105b and $\overline{BL}$ 110b and 110c from the inactive portions of the primary and complementary bit lines BL 105c and $\overline{BL}$ 110a. The isolation will reduce or eliminate any capacitively coupled noise from the active portion of the primary and complementary bit lines BL 105a and 105b and $\overline{BL}$110b and 110c to adjacent bit lines.

By placing the portions of the primary bit line BL 105a and 105c and the complementary bit line $\overline{BL}$ 110a and 110c at the voltage level of the reference voltage source $V_{cc}/2$ 326, the pre-charge and equalization circuitry 130 only has to pre-charge and equalize the voltage level of the portion of the primary and complementary bit lines BL 105b and $\overline{BL}$ 110b attached to the sense amplifier 125. This will again minimize current flow to charge the bit line capacitance $C_{b1}$ 107, 108, 112, and 113 and the coupled noise to adjacent non-selected rows of DRAM cells.

The reduction of the charging and discharging power and elimination or reduction of the coupling noise will decrease the local junction temperature of the DRAM array, improve or increase the refresh time, and allow a faster sensing speed.

Figure 5:
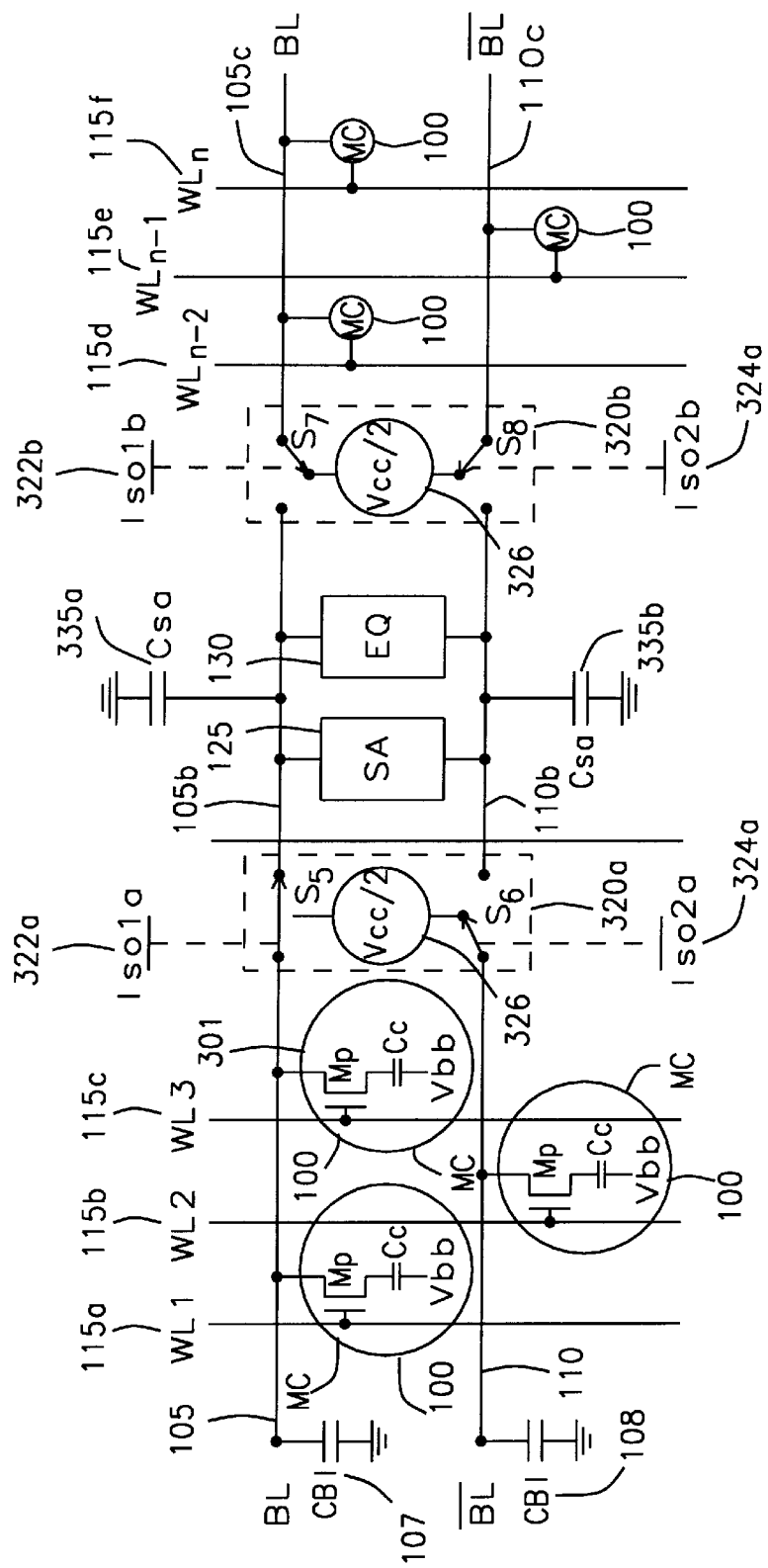
FIG. 5 is a schematic drawing of a row of DRAM cells showing a second method of operation of the isolation and pre-charge circuit of this invention.

Refer now to FIG. 5 to discuss a second embodiment of the process of reading a selected DRAM cell 301 on a row of DRAM cells 100. Prior to commencing the read operation, the switches $S_5$, $S_6$, $S_7$, and $S_8$ are conditioned respectively by the isolation voltage control circuit ISO1a 322a, ISO2a 324a, ISO1b 322b, ISO2b 324b to connect the portions of the bit lines BL 105a and 105c and $\overline{BL}$ 110a and 110c to the reference voltage source $V_{cc}/2$ 326.

The method for reading the selected DRAM cell 301 begins by activating the pre-charge and equalization circuit 130 to pre-charge the portions of primary the bit line BL 105a and the portion of the complementary bit line $\overline{BL}$ 110b to the voltage level of the reference voltage source $V_{cc}/2$ 135 of FIG. 3a. The voltage between the portions of the primary bit line BL 105a and the portion of the complementary bit line $\overline{BL}$ 110b are then equalized to remove any inequalities between the portions of the primary and complementary bit lines BL 105b and the portion of the bit line $\overline{BL}$ 110b. The pre-charge and equalization circuit is then disabled and the word line $WL_3$ 115c is activated to turn on the pass transistor $M_p$ of the selected DRAM cell 301. The charge present or absent on the cell capacitor CC of the selected DRAM cell 301 flows to or from the portions of the primary bit line BL 105a.

The isolation voltage control circuit ISO1a 322a is activated switch $S_5$ to connect the portion of the primary bit line BL 105a to the portion of the bit line primary BL 105b. The selected DRAM cell 301 is now connected to the latching sense amplifier 125 and the pre-charge and equalization circuit 130. The charge will then flow to or from the portion of the primary bit line BL 105a to or from the portion of the primary bit line 105b. This will cause the voltage level present between the portions of the primary bit line BL 105a and 105b and the portion of the complementary bit line $\overline{BL}$ 110b to vary by approximately 100–200 mV. The latching sense amplifier 125 will be activated and begin to sense the difference in voltage between the voltage present at the portions of the primary bit line BL 105a and 105b and the voltage present at the portion of the complementary bit line $\overline{BL}$ 110b. The difference will amplified and the portions of the primary bit line BL 105a and 105b will be forced toward either the voltage level of the power supply voltage source $V_{cc}$ or the voltage level of the ground reference point GND, dependent on the level of the charge present on the cell capacitor $C_c$ of the selected DRAM cell 301. The portion of the complementary bit line $\overline{BL}$ 110b will begin to be forced toward the opposite voltage level of the portions of the primary bit line BL 105a and 105b.

Once the latching sense amplifier has sensed the charge present on the cell capacitor $C_c$ of the selected DRAM cell 301 and has begun to force the portions of the primary bit line BL 105a and 105b to the appropriate voltage level, the isolation voltage control circuit ISO1a 322a will activate the switch $S_5$ to reconnect the portion of the primary bit line BL 105a to the voltage level of the reference voltage source $V_{cc}/2$ 326. The latching sense amplifier 125 will continue to force the portion of the primary bit line BL 105b and the complementary bit line $\overline{BL}$ 100b to their respective voltage levels.

During the sensing of the selected DRAM cell 301, the portion of the primary bit line BL 105c and the portions of the complementary bit line $\overline{BL}$ 110a and 110c will be maintained at the voltage level of the reference voltage source $V_{cc}/2$ 326.

The bit line capacitance $C_{sa}$ 335a is the capacitance of the portion of the primary bit line BL 105b and the bit line capacitance $C_{sa}$ 335b is the capacitance of the portion of the complementary bit line $\overline{BL}$ 110b that are within the sense amplifier 125 and the pre-charge and equalization circuit 130. By pre-charging only the portion of the primary bit line BL 105b and the portion of the complementary bit line $\overline{BL}$100b , the current required is lessened by a factor of approximately the ratio of the capacitance of the bit line capacitor $C_{b1}$ 108 to the bit line capacitance $C_{sa}$ 335b and consequently power is saved. Also, by sensing only the charge transferred from the cell capacitor $C_c$ of the selected DRAM cell 301 to the portion of the primary bit line BL 105b, the capacitive load on the latching sense amplifier 125 is balanced.

As can be seen the portions of the primary bit line BL 105c and the complementary bit line $\overline{BL}$ 110a and 110c not activated to provide the reference voltage for the sensing of the selected DRAM cell 301 are placed at the voltage level of the reference voltage source $V_{cc}/2$ 326. This will effectively isolate the active portions of the primary and complementary bit lines BL 105a and 105b and $\overline{BL}$ 110b from the inactive the portion of the primary bit line BL 105c and the portions of complementary the bit line $\overline{BL}$ 110a and 110c. The isolation will reduce or eliminate any coupled noise from the active portions of the primary and complementary bit lines BL 105a and 105b and $\overline{BL}$ 110b to adjacent bit lines.

By placing the portions of the primary and complementary bit lines line BL 105a and 105c and $\overline{BL}$ 110a and 110c at the voltage level of the reference voltage source $V_{cc}/2$ 326, the pre-charge and equalization circuitry 130 only has to pre-charge and equalize the voltage level of the portion of the primary and complementary bit lines BL 105b and $\overline{BL}$ 110b attached to the sense amplifier 125. This will again minimize current flow to charge the bit line capacitance CBL 107, 108, 112, and 113 and the coupled noise to adjacent non-selected rows of DRAM cells.

The reduction of the charging and discharging power and elimination or reduction of the coupling noise will decrease the local junction temperature of the DRAM array, improve or increase the refresh time, and allow a faster sensing speed.

While this invention has been particularly shown and described with reference to the preferred embodiments thereof, it will be understood by those skilled in the art that various changes in form and details may be made without departing from the spirit and scope of the invention.

The invention claimed is:

1. An isolation pre-charge circuit within a DRAM array to pre-charge portions a pair of bit lines within said DRAM array to a voltage level of a reference voltage source and to connect a selected DRAM cell to a latching sense amplifier, whereby said pair of bit lines includes a primary bit line and a complementary bit line, comprising:

a) a first single pole double throw switch including a common terminal connected to a first portion of the primary the bit line placed within a first sub-array of the DRAM array, a first pole connected to the reference voltage source, a second pole connected to a first terminal of the latching sense amplifier and a first terminal of a pre-charge and equalization circuit, and a control terminal connected to a control circuit to selectively couple the common terminal to the first pole and the second pole; and b) a second single pole double throw switch including a common terminal connected to a first portion of the complementary bit line placed within the first sub array, a first pole connected to the reference voltage source, a second pole connected to a second terminal of the latching sense amplifier and a second terminal of a pre-charge and equalization circuit, and a control terminal connected to a control circuit to selectively couple the common terminal to the first pole and the second pole;

c) a third single pole double throw switch including a common terminal connected to a second portion of the primary the bit line placed within a second sub-array of the DRAM array, a first pole connected to the reference voltage source, a second pole connected to the first terminal of the latching sense amplifier and the first terminal of a pre-charge and equalization circuit, and a control terminal connected to a control circuit to selectively couple the common terminal to the first pole and the second pole; and d) a fourth single pole double throw switch including a common terminal connected to a second portion of the complementary bit line placed within the second sub array, a first pole connected to the reference voltage source, a second pole connected to a second terminal of the latching sense amplifier and the second terminal of a pre-charge and equalization circuit, and a control terminal connected to a control circuit to selectively couple the common terminal to the first pole and the second pole, whereby said selected DRAM cell is read by the steps of:
activating the control terminal of the first, second, third, and fourth single pole double throw switches to couple the common pole of the first, second, third, and fourth single pole double throw switches to the first pole of said first and second single pole double throw switches to pre-charge all portions of the pair of bit lines connected to the DRAM cells within the first and second sub-arrays to the voltage level of the reference voltage source;

activating the control terminal of one of the single pole double throw switches connected to one portion of the bit line connected to selected DRAM cell within a selected sub-array to couple said one portion of the bit line to one terminal of the latching sense amplifier and the pre-charge and equalization circuit;

activating the control terminal of one of an opposite single pole double throw switch connected to an opposite portion of an opposite bit line on a non selected sub-array to couple said opposite portion of the opposite bit line to the second terminal of the latching sense amplifier and the second terminal of the pre-charge and equalization circuit; P2 pre-charging and equalizing the portions of the pair of bit lines connected to the selected DRAM cell and the latching sense amplifier and the pre-charge and equalization circuit;

activating the selected DRAM cell to transfer an electrical charge present within said selected DRAM cell to the portion of the bit line connected to said selected DRAM cell;

activating the latching sense amplifier to sense the charge transferred to said portion of the bit line attached to said selected DRAM cell; and maintaining the control terminal of the single pole double throw switches not connected to the portion of the bit line connected to the selected DRAM cell and the opposite portion of an opposite bit line on the non selected sub-array such that the common terminal is connected to the first pole to maintain said portion of the bit line not connected to said selected DRAM cell and the opposite portion of an opposite bit line on the non selected sub-array at the voltage level of said reference voltage source.

2. The isolation pre-charge circuit of claim 1 wherein the first, second, third, and fourth single pole double throw switches each further includes:
a) a first MOS transistor of a first conductivity type having a gate connected to the control terminal, a drain connected to the common terminal, and a source connected to the first pole; and
b) a second MOS transistor of a second conductivity type having a gate connected to the control terminal, a drain connected to the common terminal, and a source connected to the second pole.

3. A DRAM array to retain digital data comprising;
a) a plurality of DRAM sub-arrays, each sub-array comprising a plurality of DRAM cells arranged in a plurality of rows and columns;
b) a plurality of word lines, whereby each word line is connected to each column of DRAM cells within the plurality of DRAM sub-arrays;
c) a plurality of pairs of bit lines, whereby each pair of bit lines comprises a primary bit line and a complementary bit line connected to the primary bit line and the complementary bit line of each of the pair of bit lines;
d) a plurality of sense amplifiers, whereby each sense amplifier is connected between each pair of bit lines;
(e) plurality of pre-charge and equalization circuits, whereby each pre-charge and equalization circuit is connected between the primary bit line and the complementary bit line of each pair of bit lines, to pre-charge the portions of the pair of bit lines to a voltage level that is a voltage level of a reference voltage source that is approximately one half a voltage level of one half a power supply voltage source and to equalize any voltage variation between the portions of the pair of bit lines being pre-charged; and
f) a plurality of isolation and pre-charge circuits, whereby each isolation and pre-charge circuit is connected between the primary bit line and the complementary bit line of the pair of bit lines and connected so as to divide each bit line of said pair of bit lines into said portions, whereby each isolation and pre-charge circuit comprises:
a first single pole double throw switch including a common terminal connected to a first portion of the primary the bit line placed within a first sub-array of the DRAM array, a first pole connected to the reference voltage source, a second pole connected to a first terminal of the latching amplifier and a first terminal of a pre-charge and equalization circuit, and a control terminal connected to a control circuit to selectively couple the common terminal to the first pole and the second pole; and
a second single pole double throw switch including a common terminal connected to a first portion of the complementary bit line placed within the first sub array, a first pole connected to the reference voltage source, a second pole connected to a second terminal of the latching sense amplifier and a second terminal of a pre-charge and equalization circuit, and a control terminal connected to a control circuit to selectively couple the common terminal to the first pole and the second pole;
a third single pole double throw switch including a common terminal connected to a second portion of the primary the bit line placed within a second sub-array of the DRAM array, a first pole connected to the reference voltage source, a second pole connected to the first terminal of the latching sense amplifier and the first terminal of a pre-charge and equalization circuit, and a control terminal connected to a control circuit to selectively couple the common terminal to the first pole and the second pole; and
a fourth single pole double throw switch including a common terminal connected to a second portion of the complementary bit line placed within the second sub array, a first pole connected to the reference voltage source, a second pole connected to a second terminal of the latching sense amplifier and the second terminal of a pre-charge and equalization circuit, and a control terminal connected to a control circuit to selectively couple the common terminal to the first pole and the second pole, whereby a selected DRAM cell is read by the steps of:
activating the control terminal of the first, second, third, and fourth single pole double throw switches to couple the common pole of the first, second, third, and fourth single pole double throw switches to the first pole of said first and second single pole double throw switches to pre-charge all portions of the pair of bit lines connected to the DRAM cells within the first and second sub-arrays to the voltage level of the reference voltage source;

activating the control terminal of one of the single pole double throw switches connected to one portion of the bit line connected to selected DRAM cell within a selected sub-array to couple said one portion of the bit line to one terminal of the latching sense amplifier and the pre-charge and equalization circuit;

activating the control terminal of one of an opposite single pole double throw switch connected to an opposite portion of an opposite bit line on a non selected sub-array to couple said opposite portion of the opposite bit line to the second terminal of the latching sense amplifier and the second terminal of the pre-charge and equalization circuit;

pre-charging and equalizing the portions of the pair of bit lines connected to the selected DRAM cell and the latching sense amplifier and the pre-charge and equalization circuit;

activating the selected DRAM cell to transfer an electrical charge present within said selected DRAM cell to the portion of the bit line connected to said selected DRAM cell;

activating the latching sense amplifier to sense the charge transferred to said portion of the bit line attached to said selected DRAM cell; and maintaining the control terminal of the single pole double throw switches not connected to the portion of the bit line connected to the selected DRAM cell and the opposite portion of an opposite bit line on the non selected sub-array such that the common terminal is connected to the first pole to maintain said portion of the bit line not connected to said selected DRAM cell and the opposite portion of an opposite bit line on the non selected sub-array at the voltage level of said reference voltage source.

4. The DRAM array of claim 3 wherein the first, second, third, and fourth single pole double throw switches further includes:

a) a first MOS transistor of a first conductivity type having a gate connected to the control terminal, a drain connected to the common terminal, and a source connected to the first pole; and b) a second MOS transistor of a second conductivity type having a gate connected to the control terminal, a drain connected to the common terminal, and a source connected to the second pole.

5. A method to sense a charge representing digital data within a selected DRAM cell within one sub-array of a plurality of sub-arrays connected to a portion of one of a pair of bit lines by a latching sense amplifier comprising the steps of:

a) pre-charging those portions of the pair of bit lines connected to DRAM cells to a voltage level of a reference voltage source that is a voltage level that is one half a voltage level of a power supply voltage source;

b) connecting the portion of the one bit line of the pair of bit lines connected to the selected DRAM cell to a first input of the latching sense amplifier;

c) connecting an opposite bit line of an adjacent sub-array to provide the voltage level of the reference voltage source to a second input of the latching sense amplifier;

d) pre-charging and equalizing said portions of the one bit line and the opposite bit line connected to the selected DRAM cell and the first and second inputs of the latching sense amplifier to the voltage level of the reference voltage source;

e) activating said DRAM cell to transfer an electrical charge to the portion of the one bit line of the pair of bit lines connected to the selected DRAM cell;

f) activating said sense amplifier to sense and amplify a change in a voltage level on said portion of the one bit line of the pair of bit lines to determine the digital data; and g) maintaining the voltage level of the reference voltage source on the portions of the bit line not connected to the selected DRAM cell and the opposite bit line connected to the second input of the latching sense amplifier to isolate the portions of the bit line not connected to the selected DRAM cell and the opposite bit line connected to the second input of the latching sense amplifier from noise and to minimize power.

6. An isolation pre-charge circuit within a DRAM array to pre-charge portions a pair of bit lines within said DRAM array to a voltage level of a reference voltage source and to connect a selected DRAM cell to a latching sense amplifier, comprising:

a) a first single pole double throw switch including a common terminal connected to one portion of one of the bit lines of the pair of bit lines, a first pole connect to the reference voltage source, a second pole connected to a first terminal of the latching sense amplifier and a first terminal of a pre-charge and equalization circuit, and a control terminal connected to a control circuit to selectively couple the common terminal to the first pole and the second pole; and b) a second single pole double throw switch including a common terminal connected to one portion of a second of the bit lines of the pair of bit lines, a first pole connect to the reference voltage source, a second pole connected to a second terminal of the latching sense amplifier and a second terminal of a pre-charge and equalization circuit, and a control terminal connected to a control circuit to selectively couple the common terminal to the first pole and the second pole whereby said selected DRAM cell is read by the steps of:

activating the control terminal to couple the common pole of the first and second single pole double throw switches to the first pole of said first and second single pole double throw switches to pre-charge all portions of the pair of bit lines connected to the DRAM cells to the voltage level of the reference voltage source;

pre-charging and equalizing the portions of the pair of bit lines connected to the selected DRAM cell and the latching sense amplifier and the pre-charge and equalization circuit;

activating the selected DRAM cell to transfer an electrical charge present within said selected DRAM cell to the portion of the bit line connected to said selected DRAM cell;

activating the control terminal of one of the single pole double throw switches connected to the portion of the bit line connected to selected DRAM cell to couple for a brief period of time said portion of the bit line to one terminal of the latching sense amplifier and the pre-charge and equalization circuit;

activating the latching sense amplifier to sense the charge transferred to said portion of the bit line attached to said selected DRAM cell; and maintaining the control terminal of the single pole double throw switch not connected to the portion of the bit line connected to the selected DRAM cell such that the common terminal is connected to the first pole to maintain said portion of the bit line not connected to said selected DRAM cell at the voltage level of said reference voltage source.

7. The isolation pre-charge circuit of claim 6 wherein the brief period of time is sufficient for said latching sense amplifier to sense and amplify a variation in voltage on the portion of the bit line connected to said selected DRAM cell.

8. The isolation pre-charge circuit of claim 6 wherein the first and second single pole double throw switches further includes:
   a) a first MOS transistor of a first conductivity type having a gate connected to the control terminal, a drain connected to the common terminal, and a source connected to the first pole; and
   b) a second MOS transistor of a second conductivity type having a gate connected to the control terminal, a drain connected to the common terminal, and a source connected to the second pole.

9. A DRAM array to retain digital data comprising;
   a) a plurality of DRAM cells arranged in a plurality of rows and columns;
   b) a plurality of word lines, whereby each word line is connected to each column of DRAM cells;
   c) a plurality of pairs of bit lines, whereby each pair of bit lines is connected to each row of DRAM cells;
   d) a plurality of sense amplifiers, whereby each sense amplifier is connected between each pair of bit lines;
   e) a plurality of pre-charge and equalization circuits, whereby each pre-charge and equalization circuit is connected between each pair of bit lines, to pre-charge the portions of the pair of bit lines to a voltage level that is a voltage level of a reference voltage source that is approximately one half a voltage level of one half a power supply voltage source and to equalize any voltage variation between the portions of the pair of bit lines being pre-charged; and
   f) a plurality of isolation and pre-charge circuits, whereby each isolation and pre-charge circuit is connected between the pair of bit lines and connected so as to divide each of said pair of bit lines into said portions, whereby each isolation and pre-charge circuit comprises:
      a first single pole double throw switch including a common terminal connected to one portion of one of the bit lines of the pair of bit lines, a first pole connect to the reference voltage source, a second pole connected to a first terminal of the latching sense amplifier and a first terminal of a pre-charge and equalization circuit, and a control terminal connected to a control circuit to selectively couple the common terminal to the first pole and the second pole; and
      a second single pole double throw switch including a common terminal connected to one portion of a second of the bit lines of the pair of bit lines, a first pole connect to the reference voltage source, a second pole connected to a second terminal of the latching sense amplifier and a second terminal of a pre-charge and equalization circuit, and a control terminal connected to a control circuit to selectively couple the common terminal to the first pole and the second pole whereby said selected DRAM cell is read by the steps of:
      activating the control terminal to couple the common pole of the first and second single pole double throw switches to the first pole of said first and second single pole double throw switches to pre-charge all portions of the pair of bit lines connected to the DRAM cells to the voltage level of the reference voltage source;
      pre-charging and equalizing the portions of the pair of bit lines connected to the selected DRAM cell and the latching sense amplifier and the pre-charge and equalization circuit;
      activating the selected DRAM cell to transfer an electrical charge present within said selected DRAM cell to the portion of the bit line connected to said selected DRAM cell;
      activating the control terminal of one of the single pole double throw switches connected to the portion of the bit line connected to selected DRAM cell to couple for a brief period of time said portion of the bit line to one terminal of the latching sense amplifier and the pre-charge and equalization circuit;
      activating the latching sense amplifier to sense the charge transferred to said portion of the bit line attached to said selected DRAM cell; and
      maintaining the control terminal of the single pole double throw switch not connected to the portion of the bit line connected to the selected DRAM cell such that the common terminal is connected to the first pole to maintain said portion of the bit line not connected to said selected DRAM cell at the voltage level of said reference voltage source.

10. The isolation pre-charge circuit of claim 9 wherein the brief period of time is sufficient for said latching sense amplifier to sense and amplify a variation in voltage on the portion of the bit line connected to said selected DRAM cell.

11. The DRAM array of claim 9 wherein the first and second single pole double throw switches further includes:
   a) a first MOS transistor of a first conductivity type having a gate connected to the control terminal, a drain connected to the common terminal, and a source connected to the first pole; and
   b) a second MOS transistor of a second conductivity type having a gate connected to the control terminal, a drain connected to the common terminal, and a source connected to the second pole.

12. A method to sense a charge representing digital data within a selected DRAM cell connected to a portion of one of a pair of bit lines by a sense amplifier comprising the steps of:
   a) pre-charging those portions of the pair of bit lines connected to DRAM cells to a voltage level of a reference voltage source that is a voltage level that is one half a voltage level of a power supply voltage source;
   b) pre-charging and equalizing said portion of the bit line connected to the selected DRAM cell and the input of the sense amplifier to the voltage level of the reference voltage source;

c) activating said DRAM cell to transfer an electrical charge to the portion of the one bit line of the pair of bit lines connected to the selected DRAM cell;

d) connecting the portion of the one bit line of the pair of bit lines connected to the selected DRAM cell to one input of the sense amplifier for a brief period of time;

e) activating said sense amplifier to sense and amplify a change in a voltage level on said portion of the one bit line of the pair of bit lines to determine the digital data; and f) maintaining the voltage level of the reference voltage source on the portions of the bit line not connected to the selected DRAM cell to isolate the portions of the bit line not connected to the selected DRAM cell from noise and to minimize power.

13. The method of claim 12 wherein the brief period of time is sufficient for said latching sense amplifier to sense and amplify a variation in voltage on the portion of the bit line connected to said selected DRAM cell.

* * * * *